US012598711B2

(12) United States Patent (10) Patent No.: US 12,598,711 B2

Park et al. (45) Date of Patent: Apr. 7, 2026

(54) DISPLAY DEVICE

(71) Applicant: LG ELECTRONICS INC., Seoul (KR)

(72) Inventors: Yongnam Park, Seoul (KR); Kitae Kang, Seoul (KR); Jinha Heo, Seoul (KR); Jeongmo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 170 days.

(21) Appl. No.: 18/578,184

(22) PCT Filed: Jul. 14, 2021

(86) PCT No.: PCT/KR2021/009068

§ 371 (c)(1),
(2) Date: Jan. 10, 2024

(87) PCT Pub. No.: WO2023/286886

PCT Pub. Date: Jan. 19, 2023

(65) Prior Publication Data

US 2024/0334626 A1 Oct. 3, 2024

(51) Int. Cl.
H05K 5/02 (2006.01)

(52) U.S. Cl.
CPC ................................. H05K 5/0217 (2013.01)

(58) Field of Classification Search
CPC ............................ H05K 5/0217; H05K 5/0017

USPC .......................................... 361/807, 809, 810
See application file for complete search history.

(56) References Cited

U.S. PATENT DOCUMENTS

| | | | | |
|---|---|---|---|---|
| 2004/0090560 A1* | 5/2004 | Jang | ................... | G02F 1/133308 |
| | | | | 348/836 |
| 2012/0268902 A1* | 10/2012 | Liang | .................... | G06F 1/1679 |
| | | | | 248/221.11 |
| 2017/0094813 A1* | 3/2017 | Taniguchi | ......... | G02F 1/133308 |
| 2021/0202449 A1* | 7/2021 | Shin | .................... | H01L 25/0753 |

FOREIGN PATENT DOCUMENTS

KR 20200073600 A * 6/2020 ......... G02F 1/13336

* cited by examiner

*Primary Examiner* — Hung S. Bui
(74) *Attorney, Agent, or Firm* — Birch, Stewart, Kolasch & Birch, LLP

(57) ABSTRACT

A display device of the present invention comprises: display modules; a holding frame for fixing the display modules from the rear surface of the display modules; and a front cover positioned on the front surfaces of the display modules, wherein the front cover may include a low-brightness layer, and boundaries between unit panels of the display modules and boundaries between the display modules are not visible to viewers by virtue of the front cover having a low transmittance, thus making it possible to achieve a large continuous panel.

16 Claims, 11 Drawing Sheets

Rear film

Anti-Fog

Base film 100ʋm

Black OCA 20ʋm

GLASS/PC/PMMA (3mm)

Base film

Black OCA 20ʋm

Base film 100ʋm

Anti Glare

Front film ( a )

( b )

( a )

( b )

(a)

(b)

(a)

(b)

DISPLAY DEVICE

CROSS REFERENCE TO RELATED APPLICATIONS

This application is the National Phase of PCT International Application No. PCT/KR2021/009068, filed on Jul. 14, 2021, all of which is hereby expressly incorporated by reference into the present application.

TECHNICAL FIELD

The present disclosure relates to a multi-display device.

BACKGROUND

Digital signage is a communication tool that can induce marketing, advertising, training effects and customer experience of companies. It is a display device that provides specific information as well as broadcast programs in public places such as airports, hotels, hospitals, and subway stations.

The digital signage is a medium that displays various content and commercial advertisements by installing display devices such as a liquid crystal display (LCD), a plasma display panel (PDP), and an organic light emitting diode (OLED) in outdoor certain places or street furniture. The digital signage can now be installed on all moving lines, where the public moves, such as apartment elevators, subway stations, subways, buses, universities, banks, convenience stores, discount stores, shopping malls.

When configuring a single screen using a plurality of display panels or display devices, the digital signage has a problem that a screen distortion occurs due to a difference in level between adjacent display panels in an up-down direction or in a left-right direction.

To protect the neighboring display modules and minimize viewer's recognition of boundaries between the modules, a front cover to cover front surfaces of the plurality of display modules arranged in a grid may be further disposed. However, because of a material of the front cover and a fact that the multi-display device is installed outdoors, thermal deformation caused by a temperature difference may occur.

SUMMARY

Technical Problem

The present disclosure is to resolve the foregoing and other problems. A purpose of the present disclosure is to provide a display device in which a front cover located on front surfaces of display modules may maintain a flat surface even during thermal deformation.

Technical Solutions

A display device includes display modules, a frame fixing the display modules on rear surfaces of the display modules, and a front cover located on front surfaces of the display modules, and the front cover includes a low-brightness layer.

The low-brightness layer may contain a low-brightness color with a transmittance equal to or higher than 20% and equal to or lower than 60% compared to a transparent film.

The low-brightness layer may include a base plate that has been subjected to a low-brightness treatment.

The front cover may include a base plate, a film layer attached to at least one of a front surface and a rear surface of the base plate, and an OCA layer attaching the film layer to the base plate, and at least one of the base plate, the film layer, and the OCA layer may be subjected to a low-brightness treatment to form the low-brightness layer.

The display device may further include a surface-treatment layer located at an outer surface of the film layer, and the surface-treatment layer may include a layer that has been subjected to a surface treatment of at least one of anti-fog treatment and anti-glare treatment.

The front cover may contain at least one of glass, polycarbonate (PC), and polymethyl methacrylate (PMMA).

A display device includes display modules, a frame fixing the display modules on rear surfaces of the display modules, a frame fastening portion formed on the frame, a front cover located on front surfaces of the display modules, and a cover fastening portion formed on the front cover, and the cover fastening portion is fastened with the frame fastening portion to be movable in at least one of a horizontal direction and a vertical direction of the display module.

The cover fastening portion may include a first bracket, and a second bracket coupled to the first bracket to be movable in at least one of a first direction and a second direction perpendicular to the first direction, and one of the first bracket and the second bracket may be fixed to the front cover, and the other may be fixed to the frame fastening portion.

The display device may further include a sliding slot defined in the first bracket and extending in the first direction, and a connector extending through the sliding slot and coupled to the second bracket, and when the first bracket moves in the first direction with respect to the second bracket, a location in the first direction of the connector in the sliding slot may change.

The connector may include a body extending in the second direction and extending through the sliding slot, and a head located on one side of the body and having a diameter greater than a width of the sliding slot, and the second bracket may include a boss accommodating at least a portion of the body.

A length of the body may be greater than a thickness of the first bracket with the sliding slot defined therein, and when the first bracket moves in the second direction with respect to the second bracket, a location in the second direction of the connector in the sliding slot may change.

The cover fastening portion may include a metal fastening portion located on an outer peripheral portion of the front cover, and the frame fastening portion may include a fastening magnet magnetically coupled to the metal fastening portion.

The frame fastening portion and the cover fastening portion may respectively include a plurality of frame fastening portions and a plurality of cover fastening portions arranged along a perimeter of a collection of the display modules, and the cover fastening portion located at a center of one side of the collection of the display modules may be immovably fixed to the frame fastening portion.

The display device may further include a deco frame covering an outer peripheral portion of the frame, and the deco frame may include a first decor located on each side of the display device, and a second decor at least partially overlapping the first decor and located at each corner of the display device.

The first decor and the second decor may be coupled to the cover fastening portion.

The first decor may form a step at an end thereof and includes a thin first overlapping portion, and the second decor may further include a second overlapping portion at least partially overlapping the first overlapping portion at an end thereof, and a sum of thicknesses of the first overlapping portion and the second overlapping portion may be equal to a thickness of the first decor and the second decor.

The front cover may include a base plate, a film layer attached to at least one of a front surface and a rear surface of the base plate, and an OCA layer attaching the film layer to the base plate, and at least one of the base plate, the film layer, and the OCA layer is subjected to a low-brightness treatment to form the low-brightness layer.

Advantageous Effects

According to one embodiment of the present disclosure, via the front cover with the low transmittance, the boundaries between the unit panels of the display module and the boundaries between the display modules are not visible to the viewer, so that the continuous large panel may be implemented.

Additionally, the front surfaces of the display modules may be protected by applying the front cover.

Additionally, the front cover remains flat even during the thermal deformation, preventing the distortion of the screen.

Additionally, when the front cover undergoes the thermal deformation, the frame and the fastening portion are not be separated from each other or damaged, so that the increase in the maintenance cost may be prevented.

Additional scope of applicability of the invention will become apparent from the following detailed description. However, since various changes and modifications within the spirit and scope of the invention can be understood by those skilled in the art, it should be understood that specific embodiments, such as the detailed description and the preferred embodiments of the invention, are given as examples.

DETAILED DESCRIPTION

Figure 1:
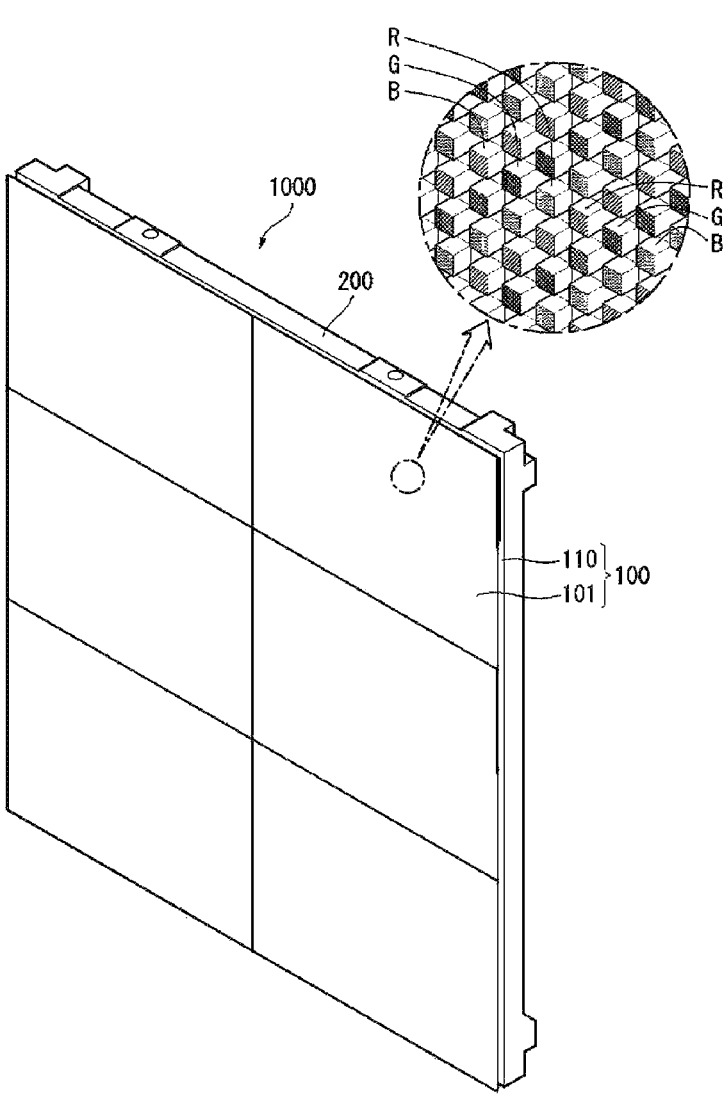
FIGS. 1 to 2 are diagrams showing examples of a display device according to an embodiment of the present disclosure.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Hereinafter, the embodiments of the invention are described using a Light Emitting Diode (LED) panel as an example of a display panel. Other display panels may be used. For example, an organic light emitting diode (OLED) display panel, a plasma display panel (PDP), a field emission display (FED) panel, Liquid Crystal Display (LCD) and may be used.

Figure 2:
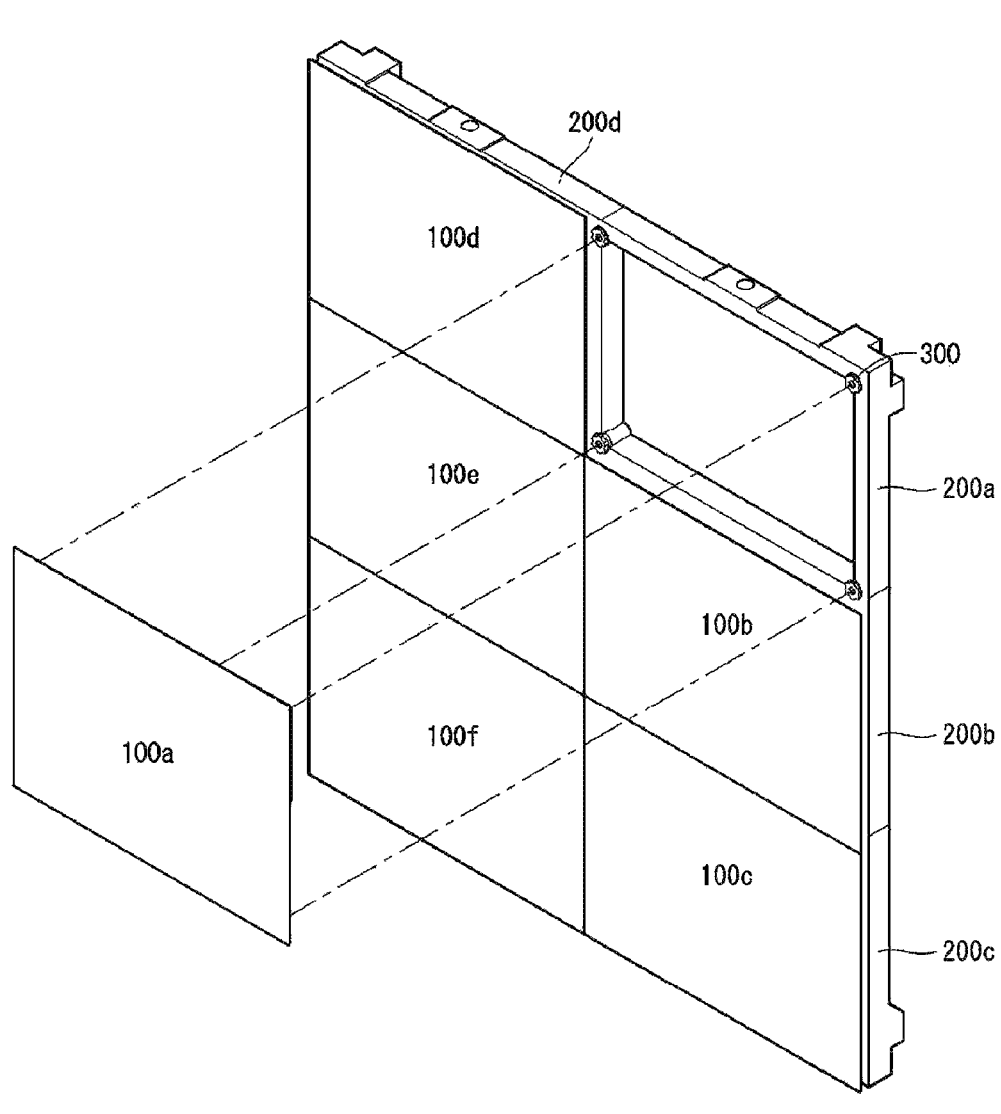

Referring to FIGS. 1 and 2, a multi-display device 1000 may include a display module 100 capable of displaying images, a frame 200 supporting the display module 100, and a displacement adjustment unit 300 mounted between the display module 100 and the frame 200 to adjust a distance therebetween.

The display module 100 may include a display panel 101 and a module cover 110 positioned behind the display panel 101.

The display panel 101 may include a plurality of pixels R, G, B. The plurality of pixels R, G, and B may be formed in each region where a plurality of data lines and a plurality of gate lines cross. The plurality of pixels R, G, B may be disposed or arranged in a matrix form.

For example, the plurality of pixels R, G, and B may include a red (R) sub-pixel, a green (G) sub-pixel, and a blue (B) sub-pixel. The plurality of pixels R, G, and B may further include a white (hereinafter, 'W') sub-pixel.

In the display panel 101, a side on which images can be observed may be referred to as a front side or a front surface. When the display panel 101 displays the images, a side on which the images cannot be observed may be referred to as a back side or a back surface. When looking at the display panel 101 from the front side or the front surface, an upper part may be referred to as an upper side or an upper surface. Similarly, a lower part may be referred to as a lower side or a lower surface. Similarly, a right part may be referred to as a right side or a right surface, and a left part may be referred to as a left side or a left surface.

The module cover 110 may be disposed behind the display panel 101 to protect the back surface of the display panel 101 from outside.

The display module 100 may include a first display module 100a to a sixth display module 100f. The first display module 100a to the sixth display module 100f may be arranged to be adjacent to each other in an up-down direction and a left-right direction.

For example, the first display module 100a may be disposed on an upper right side of the frame 200. The second display module 100b may be disposed below the first display module 100a. The third display module 100c may be disposed below the second display module 100b. The fourth display module 100d may be disposed on the left side of the first display module 100a. The fifth display module 100e may be disposed below the fourth display module 100d and on the left side of the second display module 100b. The sixth display module 100f may be disposed below the fifth display module 100e and on the left side of the third display module 100c.

The frame 200 may be disposed behind the plurality of display modules 100. A front surface of the frame 200 may face the back surface of the display module 100. The frame 200 may be disposed to correspond to the display module 100 in a thickness direction or a back-and-forth direction of the display module 100. The frame 200 may be formed in a frame shape in which a central region is opened. The frame 200 may be formed to be long in the up-down direction and the left-right direction so that the plurality of display modules 100 may be mounted. For example, a length of an upper side of the frame 200 may be substantially the same as a sum of a length of the upper side of the first display module 100a and a length of the upper side of the fourth display module 100d. A length of a right side of the frame 200 may be substantially the same as a sum of a length of the right side of the first display module 100a, a length of the right side of the second display module 100b, and a length of the right side of the third display module 100c. But it is not limited thereto. The frame 200 may be formed to be longer or shorter than the display module 100 according to an external environment such as a building or a wall to be installed.

The frame 200 may have a thickness greater than a thickness of the plurality of display modules 100.

Although one frame 200 is shown in FIGS. 1 and 2, but it is not limited thereto. The frame 200 may include a first frame 200a to a sixth frame 200f For example, the first frame 200a to the sixth frame 200f may be stacked or assembled in substantially the same manner as the first display module 100a to the sixth display module 100f described above. Thus, the n-th display module 100 may be mounted on the n-th frame 200, where n may be a natural number.

The displacement adjustment unit 300 may be disposed between the plurality of display modules 100 and the frame 200. The displacement adjustment unit 300 may be mounted on the frame 200 in the thickness direction of the display module 100. The displacement adjustment unit 300 mounted on the front surface of the frame 200 may be attached to the back surface of the display module 100. The displacement adjustment unit 300 can adjust a distance between the back surface of the display module 100 and the front surface of the frame 200. The displacement adjustment unit 300 may be a plurality of displacement adjustment units. The displacement adjustment unit 300 may be disposed at each of corners of the frame 200. The displacement adjustment unit 300 may be disposed at each corner of the display module 100 and the frame 200, and can adjust the distance therebetween.

Figure 3:
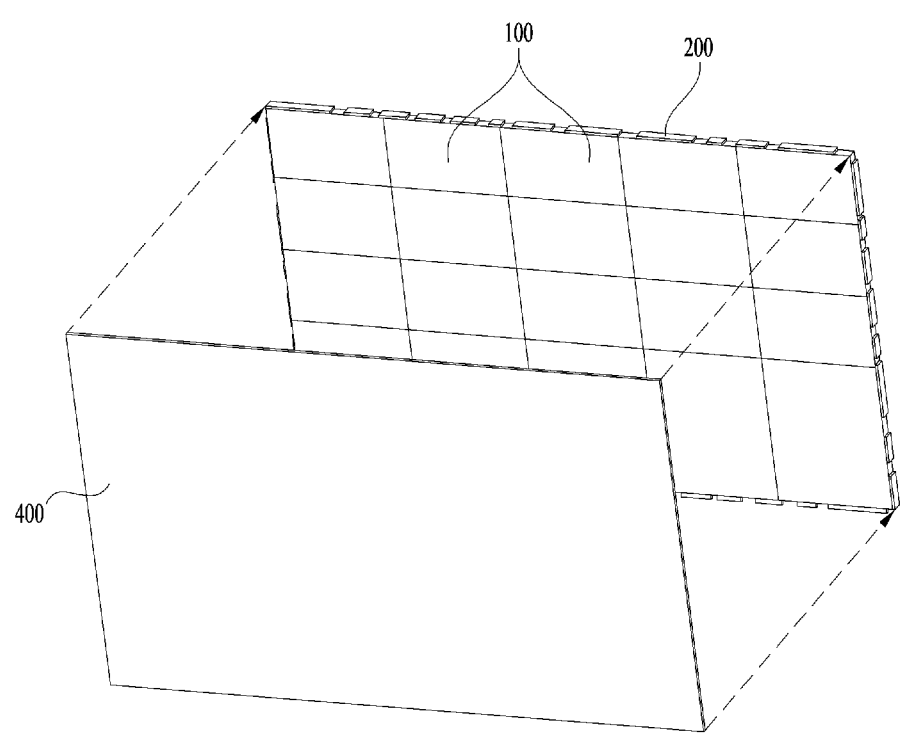
FIG. 3 is a diagram illustrating a display device according to an embodiment.

FIG. 3 is a diagram illustrating the display device 1000 according to an embodiment. The display modules 100 may be arranged in a grid and a front cover 400 located on front surfaces of the display modules 100 may be further included.

The front cover 400 protects the front surfaces of the display modules 100 from a physical impact and prevents contamination of the front surfaces. In addition, attaching the front cover 400 has an effect of connecting the boundaries between the display modules 100, which has an advantage of minimizing exposure of the boundaries between the display modules 100 to a viewer.

In particular, when the front cover includes a low-brightness layer that has been treated to have low brightness, an effect of hiding the boundaries between the display modules or unit panels is increased. The low-brightness layer may be manufactured as a dark color such as black is added thereto to have a transmittance of about 20 to 60%. When the display device is not operating, the front cover, which includes the low-brightness layer, may implement a black screen such that the inside is not easily visible, and when the display device is operating, because an amount of light from the display panels is great, an image output from the display device may be viewed from the front.

The front cover 400 may include a thin base plate made of a material such as glass, polycarbonate (PC), or polymethyl methacrylate (PMMA).

The base plate itself may become the low-brightness layer as a low-brightness material is added thereto, or a low-brightness film layer (a front film or a rear film) may be stacked to at least one of a front surface or a rear surface of a transparent base plate to manufacture the low-brightness layer.

Figure 4:
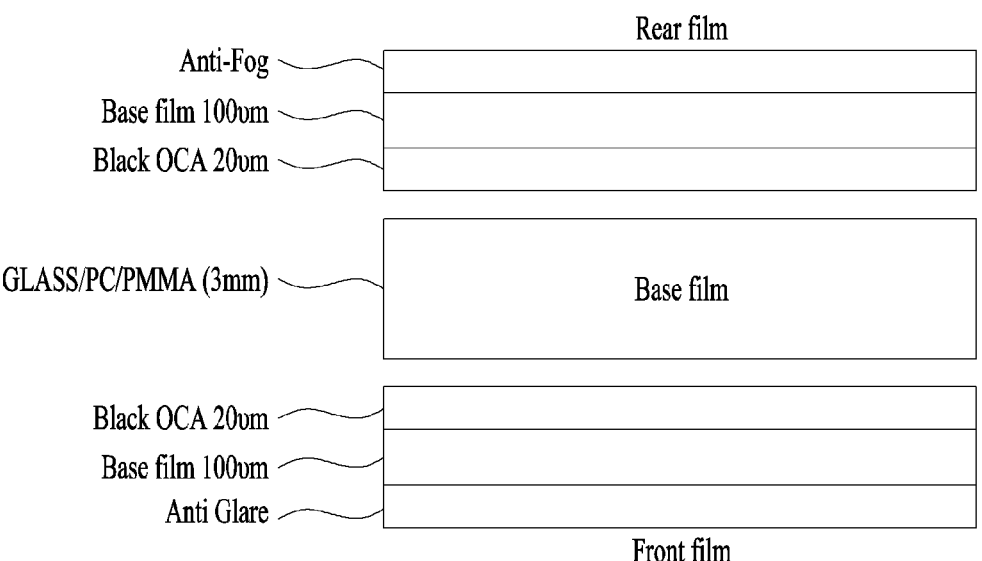
FIG. 4 is a drawing showing an example of a layered structure of a front cover of the present disclosure.

Referring to FIG. 4, the front cover 400 of the present embodiment includes a rear film layer (the rear film) located on the rear surface of the base plate and a front film layer (the front film) located on the front surface of the base plate.

The front cover may include only one of the rear film layer and the front film layer, or both the film layers may be attached to both surfaces of the base plate. When the film layers are attached to the both surfaces of the base plate layer, both the front film layer and the rear film layer may be subjected to the low-brightness treatment, or one of the front film layer and the rear film layer may be subjected to the low-brightness treatment. Alternatively, as described above, the base plate itself may be subjected to the low-brightness treatment.

A surface-treatment layer may be formed at an outer surface of the film layer, and an OCA layer for attachment to the base plate may be formed at an inner surface.

The surface-treatment layer may be subjected to a surface treatment such as anti-fog or anti-glare treatment to help ensure that the neighboring display modules 100 are viewed to be smoothly connected to each other.

In addition, the anti-fog treatment may be applied to the rear film to prevent water droplets from forming between the display module 100 and the front cover 400 caused by moisture. When the display device 1000 is installed outside, reflections may occur by sunlight or the like, making it difficult to view the image. To prevent this, anti-glare treatment may be applied to the front film.

The surface-treatment layer (the Anti-Glare or the Anti-Fog) may contain a fine pattern, which may cause a Newton's ring or moiré phenomenon to appear in the image output on the display panel. The Newton's ring or moiré phenomenon refers to occurrence of a stain resulted from pattern overlapping or a difference in contact surfaces between a rear surface of the front cover 400 and the display module 100. To prevent such Newton's ring or moiré phenomenon, an anti-Newton's ring treatment may be performed to prevent occurrence of interference patterns caused by such refraction of light.

The surface-treatment layer may be manufactured using a micro gravure method. The micro gravure refers to a method of performing surface treatment/coating by forming a predetermined engraved pattern in a roll and transferring a material filled in the engraved pattern. This is a suitable method when forming the pattern and coating the same thinly (3 to 5 μm).

To implement the film layer as the low-brightness layer, the low-brightness material may be added to the film layer itself or the low-brightness treatment may be performed on the OCA layer for attaching the film layer to the base plate.

The OCA layer may be formed by stacking an OCA film on the film layer, but the OCA layer may also be formed by applying an OCA solution to the film layer using a slot die method. The slot die method is a method of coating the film layer by injecting a coating solution (the OCA solution) into a space between a die and the film layer. The slot die method is a suitable method for forming a thick coating layer with a thickness equal to or greater than 10 μm.

In a case of film lamination, when laminating a large-area film, lamination is difficult because of a phenomenon of sagging of the film. Further, because of a difference in tension, a portion that is pulled may become thin and a portion where the tension is weak may become thick. In particular, in a case of OCA that has a color, the slot die method may form a uniform coating layer, and thus, render a more uniform black color than the OCA film lamination method.

In this regard, a black OCA means formation of a low-brightness layer that is not completely black but has a predetermined transmittance. For example, a concentration thereof may be adjusted such that the layer has a transmittance equal to or higher than 20% and equal to or lower than 60%.

An OCA of the rear film layer may be coated using a black OCA solution containing a black color, and the front film layer may be coated with a transparent OCA. Alternatively, as shown in FIG. 4, when both the front and rear film layers are coated with the same black OCA, the front and rear films may be the same film.

The front cover 400 may be coupled to the frame 200 that fixes the display modules 100 arranged in the grid shape. As shown in FIG. 3, an outer peripheral portion of the frame 200 may provide a fastening portion to which the front cover 400 located on the front and a deco frame 500 that covers a side peripheral portion are fastened.

The front cover 400 may be positioned on the front surfaces of the display modules 100 as cover fastening portions 410 and 420 formed on a peripheral portion of the front cover 400 and frame fastening portions 210 and 220 formed on the frame are fastened with each other. A plurality of fastening portions may be located along a peripheral portion of the display device 1000.

Figure 5:
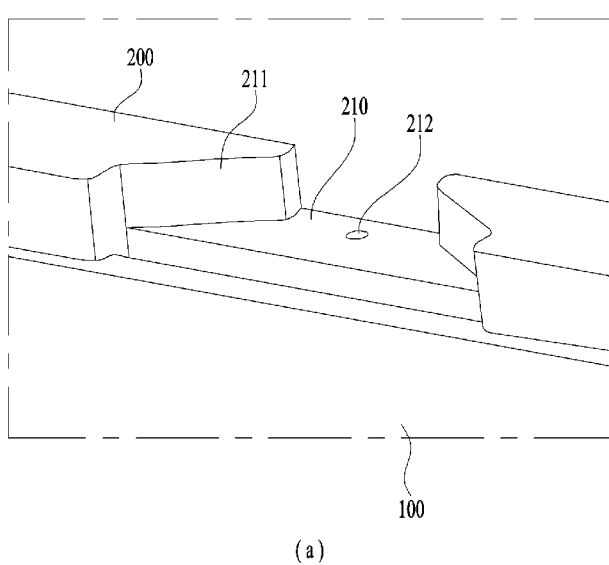
FIG. 5 is a diagram showing a frame fastening portion.
Figure 5:
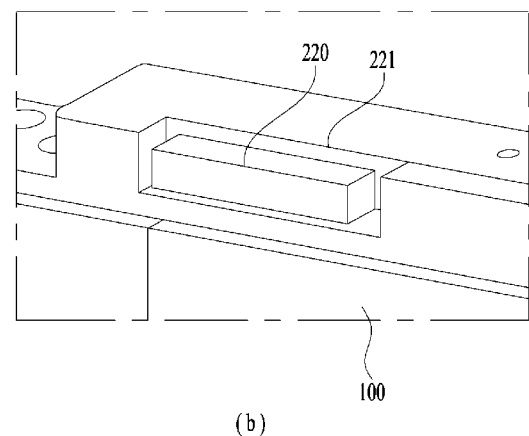

FIG. 5 is a diagram showing the frame fastening portions 210 and 220. There is the first frame fastening portion 210 in a form including an inclined surface as shown in (a) in FIG. 5, and there is the second frame fastening portion 220 including a magnet as shown in (b) in FIG. 5. The frame fastening portion may be composed of only one of the two types of frame fastening portions 210 and 220, or may have the two types of frame fastening portions 210 and 220 in an alternating or mixed manner.

The first frame fastening portion 210 may include a concave groove including the inclined surface, and the first cover fastening portion 410 may be inserted into the first frame fastening portion 210 from the front. The first frame fastening portion 210 may further include a screw hole 212 for fixing the first cover fastening portion 410 after the first cover fastening portion 410 is inserted.

The second frame fastening portion 220 may include the magnet, and a magnet seating portion 221 may be defined concavely to allow the magnet to be inserted from the front of the frame 200.

Figure 6:
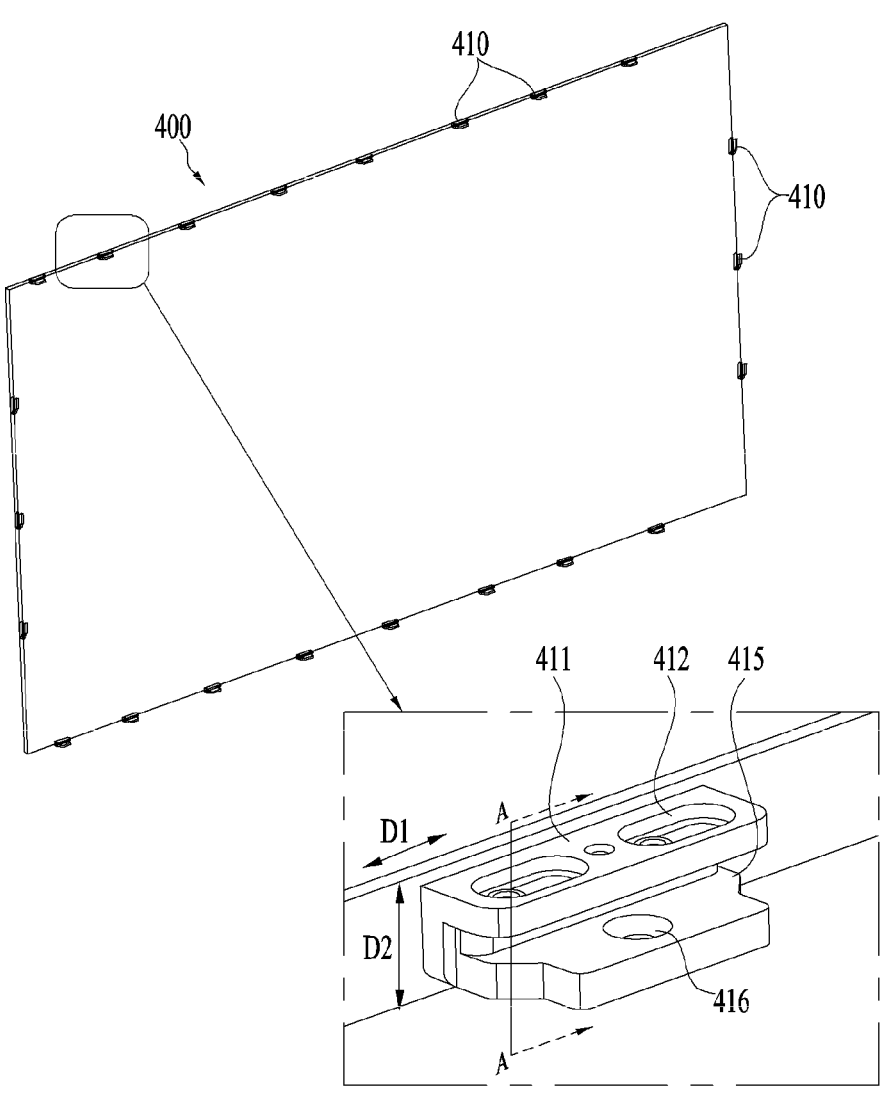
FIG. 6 is a diagram showing a cover fastening portion.

FIG. 6 is a diagram showing the cover fastening portions 410 and 420. The cover fastening portions 410 and 420 may be located on a peripheral portion of the rear surface of the front cover 400 so as not to be exposed to the outside of the front cover 400.

A bezel 420 may be made of an opaque material such that the frame 200 is not exposed on an outer peripheral portion of the front cover 400. By forming the cover fastening portion on the bezel 420, visual exposure of the cover fastening portions 410 and 420 to the front may be avoided.

Figure 7:
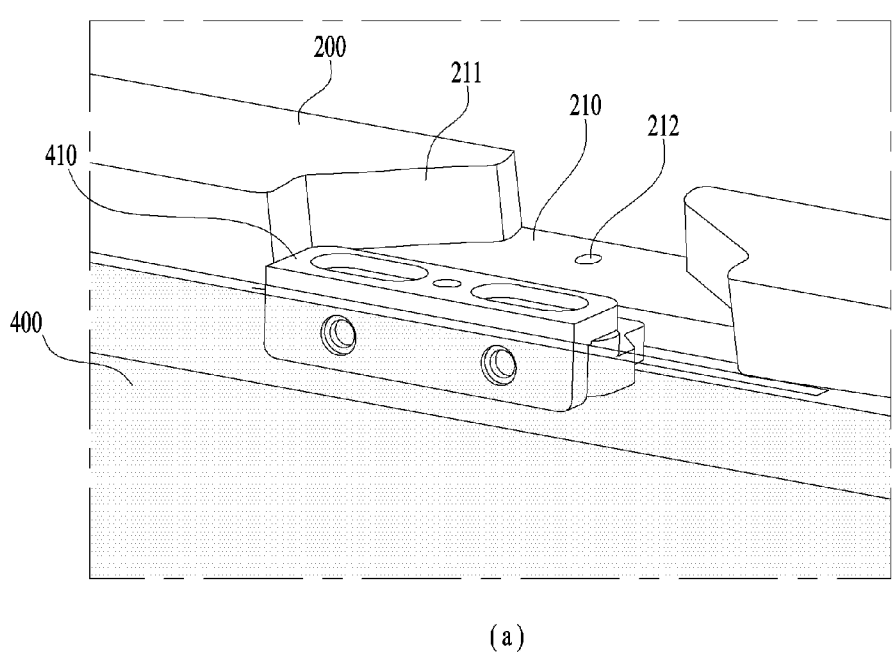
FIG. 7 is a diagram showing a method for coupling a cover fastening portion and a frame fastening portion to each other.
Figure 7:
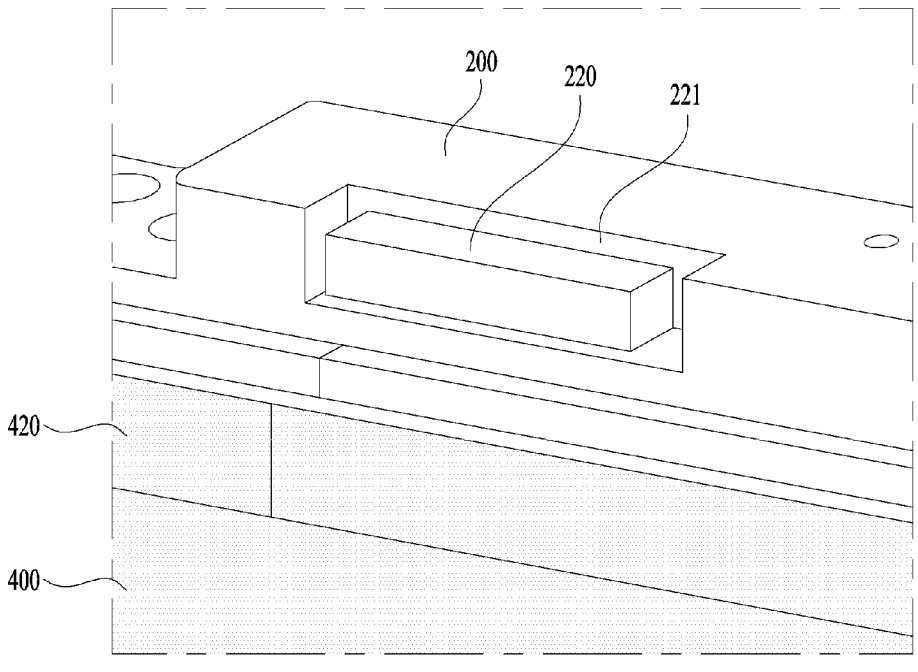

FIG. 7 is a diagram showing a method for fastening the cover fastening portions 410 and 420 with the frame fastening portions 210 and 220. (a) shows the first cover fastening portion 410 and the first frame fastening portion 210 being fastened to each other, and (b) shows the second cover fastening portion 420 and the second frame fastening portion 220 being fastened to each other.

The first cover fastening portion 410, which is fastened to the first frame fastening portion 210, has a shape of protruding in a rearward direction while being coupled to the bezel 420, and is composed of a first bracket 411 that is coupled to the front cover 400 and a second bracket 415 fixed to the first frame fastening portion 210.

The second cover fastening portion 420 fastened to the second frame fastening portion 220 may contain a magnetic material such as a metal that is attached to the magnet 220. The magnetic material may be applied to the bezel 420 of the front cover 400, or the bezel 420 may be made of a metal material and attached to the magnet.

Because the second frame fastening portion 220 and the second cover fastening portion 420 are magnetically attached to each other, even when locations thereof do not exactly match each other, the fastening portions may be attached to each other by a magnetic force and the second cover fastening portion 420 may be changed in a location relative to the second frame fastening portion 220 while moving in a direction of the surface of the display device 1000.

Unlike the display module 100, the front cover 400 may change in a size depending on a temperature change because of a great thermal expansion coefficient. When the display device 1000 in the present disclosure is installed outdoors, the temperature may change by 50 to 60° C. or more over a year, which may result in significant thermal expansion and contraction. When the frame fastening portions 210 and 220 and the cover fastening portions 410 and 420 are fixed so as not to be movable, the front cover 400 may be bent or the fastening portion may be damaged because of the thermal expansion or contraction of the front cover 400.

As described above, because the fastening of the second frame fastening portion 220 and the second cover fastening portion 420 is achieved using magnetism, even when the front cover 400 is thermally expanded or contracted, the front cover 400 may maintain the fastened state and may change in the fastened location by sliding.

In one example, the first cover fastening portion 410 and the first frame fastening portion 210 may be fixed in a location in a thickness direction of the display device, but may be slidable at locations in the surface direction, that is, in horizontal and vertical directions of the display device to remain fastened to each other even when the front cover 400 thermally expands.

The first cover fastening portion 410 may be composed of the first bracket 411 coupled to the front cover 400 and the second bracket 415 coupled to the second frame fastening portion 220, and the first bracket 411 and the second bracket 415 may be coupled in a manner of being slidable in a first direction or a second direction. A direction in which a side of the front cover 400 extends is referred to as the first direction, and a direction perpendicular thereto is referred to as the second direction.

A first direction of the first cover fastening portion 410 located on top of or beneath the display panels is a horizontal direction, but a first direction of the first cover fastening portion 410 located on the side is a vertical direction.

Figure 8:
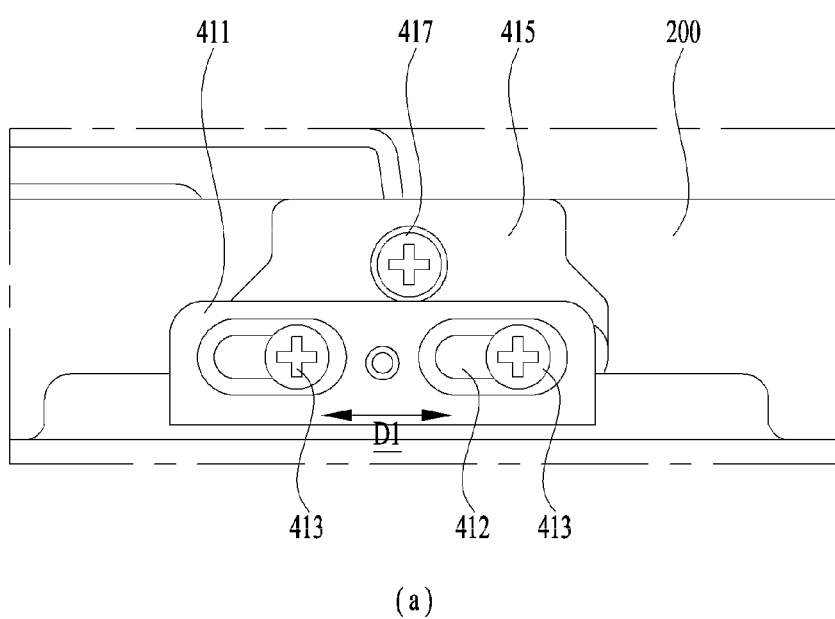
FIG. 8 is a diagram for illustrating a moving direction of a cover fastening portion.
Figure 8:
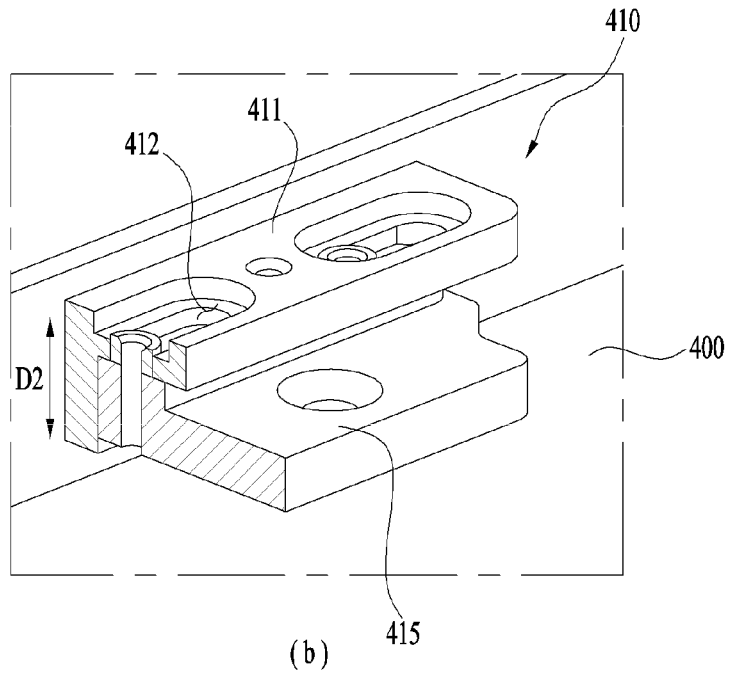

FIG. 8 is a diagram for illustrating a moving direction of a cover fastening portion. (a) in FIG. 8 shows a movement in the first direction and (b) in FIG. 8 shows a movement in the second direction in a cross-section A-A in FIG. 6.

A sliding slot 412 defined in the first bracket 411 may extend in the first direction, and may include a pair of sliding slots arranged side by side in the first direction as shown in (a) in FIG. 8. A connector 413 that couples the first bracket 411 and the second bracket 415 to each other extends in the second direction and extends through the sliding slot 412.

The connector 413 may move in a longitudinal direction of the sliding slot 412, in the first direction. When the front cover 400 is deformed by the thermal expansion and the location of the cover fastening portion changes in the first direction, the first bracket 411 moves together with the front cover 400. While the second bracket 415 is fixed to the frame 200, the fastened state of the first bracket 411 and the second bracket 415 may be maintained via the connector 413.

The connector 413 includes a body extending in the second direction and extending through the sliding slot 412, and a head located on one side of the body and having a diameter larger than a width of the sliding slot 412.

The connector 413 may have a screw-like shape as shown in FIG. 8, and a boss of the second bracket 415 to which the connector 413 is fastened may protrude and be located within the sliding slot. In this case, an outer diameter of the boss must be smaller than the width of the sliding slot.

The head may be positioned on an opposite side of the second bracket 415 based on the sliding slot 412 to maintain the connector 413 fastened to the first bracket 411. To prevent the head from protruding from the first bracket 411, a groove may be defined around the sliding slot to have a width corresponding to a width of the head, as shown in FIG. 7.

When a longitudinal portion of the connector 413 or the boss extends through the sliding slot, a length of the boss is greater than a thickness of the first bracket 411 in which the sliding slot is defined, so that the connector 413 is movable not only in the first direction but also in the second direction by a predetermined distance in the sliding slot.

Therefore, the relative locations of the first bracket 411 and the second bracket 415 may be changed in the first direction or the second direction, and the location of the front cover 400 relative to the frame 200 may change accordingly.

The description has been made that the first bracket 411 is the member connected to the front cover 400 and the second bracket 415 is the member inserted into and fixed to the first frame fastening portion 210. However, on the contrary, the first bracket 411 with the sliding slot defined therein may be fastened to the first frame fastening portion 210 and the second bracket 415 may be fixed to the front cover 400.

Figure 9:
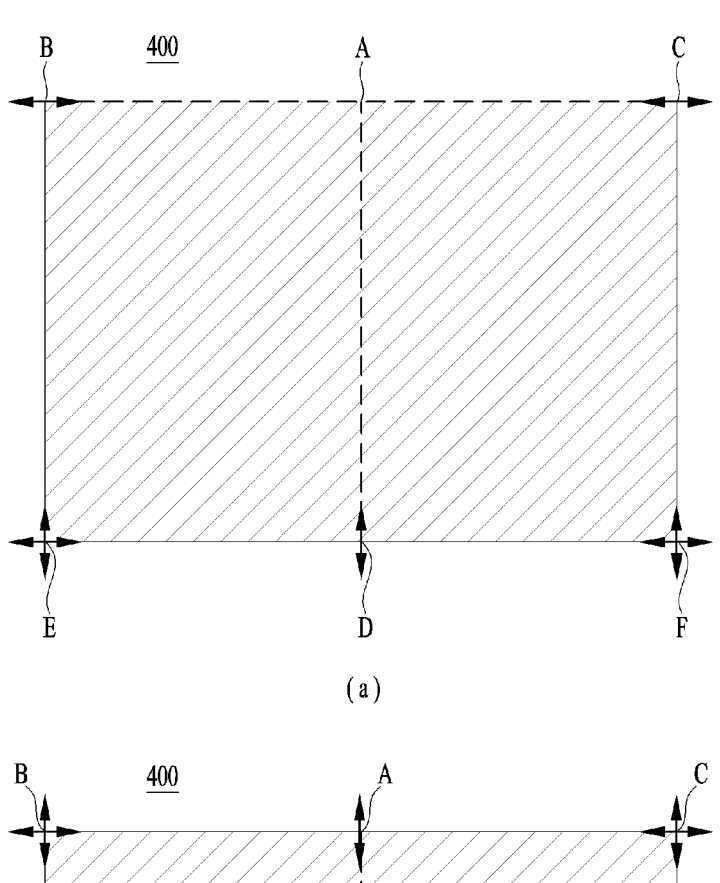
FIG. 9 is a diagram showing a direction of thermal expansion of a front cover.
Figure 9:
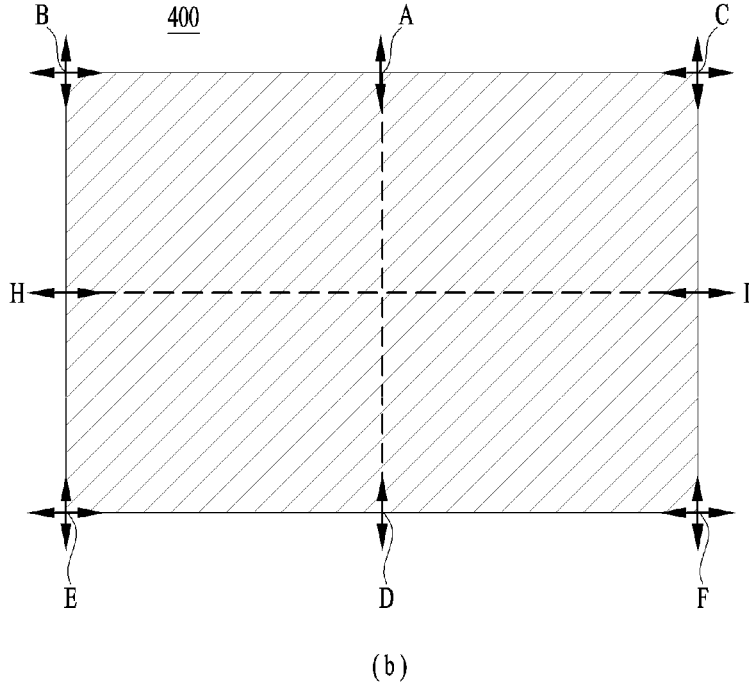

FIG. 9 is a diagram showing a direction of the thermal expansion of the front cover 400. Because the thermal expansion occurs in the surface direction, the front cover 400 may be deformed in both the horizontal direction and the vertical direction. The farther from a reference point, the greater the deformation distance, so that when the reference point is located at a center, a moving distance at the farthest location from the reference point may be small.

As shown in (a) in FIG. 9, when the frame fastening portions 210 and 220 and the cover fastening portions located at a central portion A of an upper side, which is a long side, are fixed so as not to be slidable, a horizontal displacement becomes maximum at left and right ends (a left side and a right side), and a vertical displacement becomes maximum at a lower side.

Because a vertical movement does not occur on the upper side, the first cover fastening portion 410 located on the upper side does not interfere with the thermal deformation of the front cover 400 even when being fastened to the first bracket 411 and the second bracket 415 so as not to move in the second direction.

In an embodiment of (a) in FIG. 9, a point A has no movement, points B and C may only slide in the left and right direction, a point D may slide in the vertical direction, and points E and F may slide in both the vertical direction and the left and right direction.

Alternatively, when the reference point is set at the center of the front cover 400 as shown in (b) in FIG. 9, central points A, D, H, and I of the respective sides may not move in extending directions of the respective sides, but may slide in directions perpendicular to the respective sides. In a case of each corner B, C, E, or F, there is an advantage that a maximum displacement in the vertical direction is smaller than that in the embodiment of (a).

Figure 10:
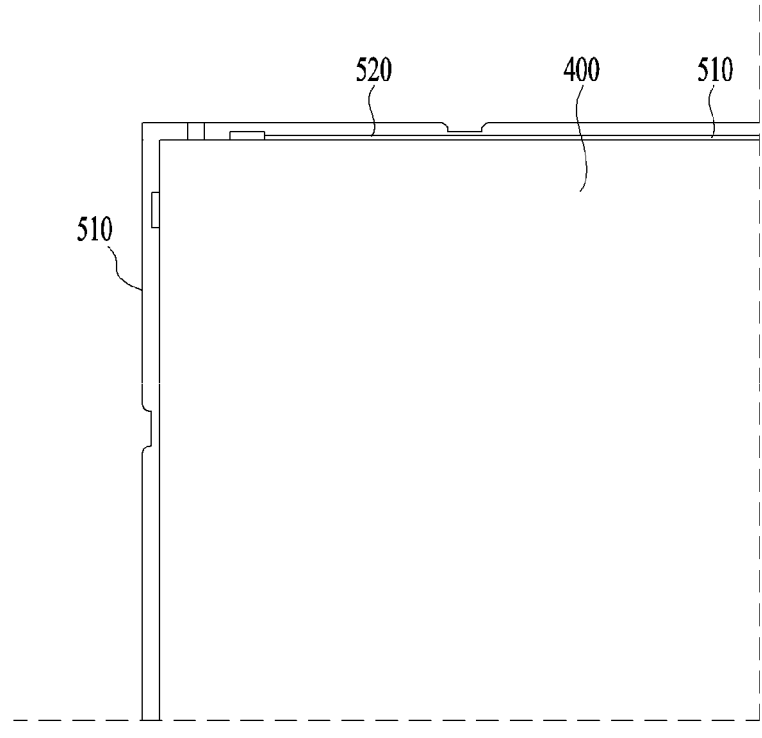
FIGS. 10 and 11 are diagrams showing a deco frame.
Figure 11:
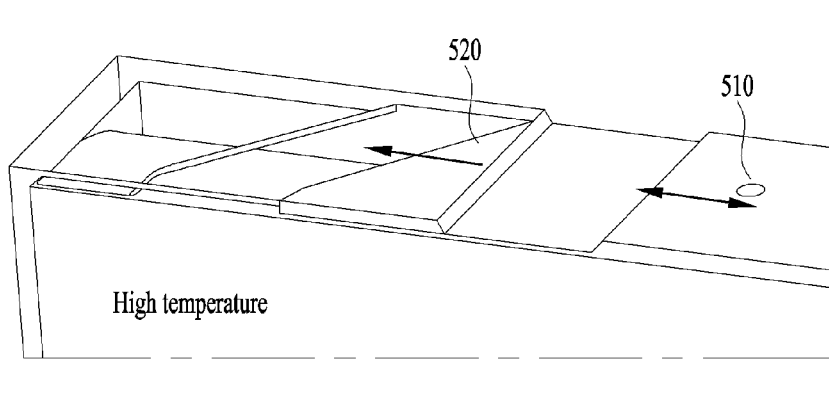
Figure 11:
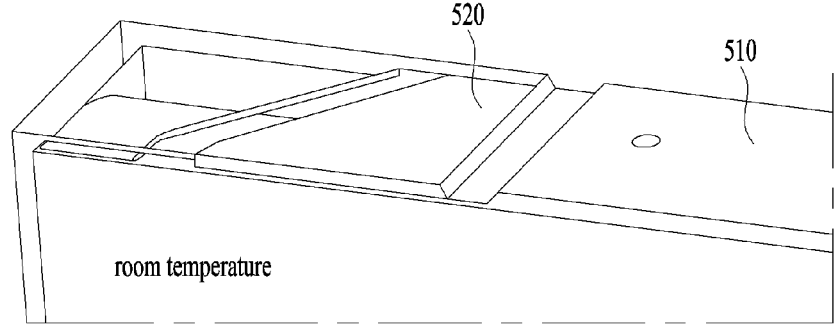
Figure 11:
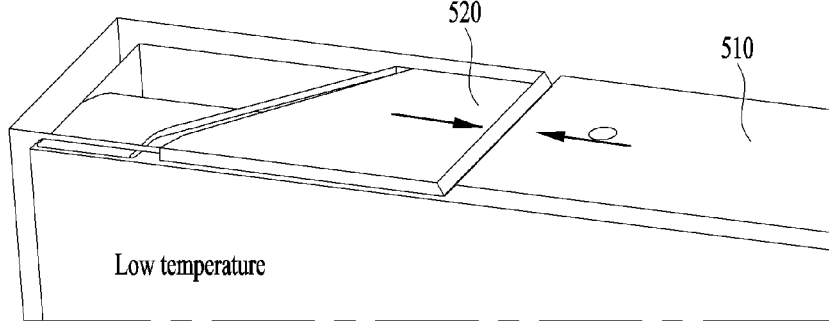

FIGS. 10 and 11 are diagrams showing the deco frame 500. The deco frame 500 surrounds side peripheral portions of the frame 200 and forms a side outer appearance of the display device 1000.

When the deco frame 500 is fastened to the frame 200, and when the front cover 400 thermally expands, a space may be created between the deco frame 500 and the front cover 400, or the front cover 400 may not be able to expand because the front cover 400 gets caught on the deco frame 500, so that the front cover 400 may be bent or damaged.

Therefore, even when the front cover 400 thermally expands, the deco frame 500 may be coupled to the cover fastening portion 410 such that the deco frame 500 is located at an end of the front cover 400. Because the cover fastening portion 410 moves together when the front cover 400 expands and contracts, the deco frame 500 may always be located at the end of the front cover 400.

However, because a thermal expansion coefficient of the deco frame 500 and that of the front cover 400 are different from each other, when the temperature changes and the thermal deformation occurs, lengths of the front cover 400 and the deco frame 500 become different from each other.

To offset the thermal deformation of the front cover 400, the deco frame 500 may be implemented by being divided into several portions 510 and 520. The deco frame 500 may include the first decor 510 located on the side and the second decor 520 located at a corner of the display device 1000.

The second decor 520 may be disposed to overlap ends of the first decors 510 located on two sides in a ⌐-shape. When there is no overlapping portion, the frame 200 may be exposed to the outside, so that the first decor 510 and the second decor 520 may overlap each other as shown in FIG. 11.

To minimize a step when the first decor 510 and the second decor 520 are disposed to overlap each other, the first decor 510 may further include a first overlapping portion that forms the step at the end thereof and is thin, and the second decor 520 may further include a second overlapping portion that at least partially overlaps the first overlapping portion at an end thereof. A sum of the first overlapping portion and the second overlapping portion may correspond to a thickness of the deco frame 500.

As shown in FIG. 11, at a high temperature such as (a), an overlapping area of the first overlapping portion and the second overlapping portion is small, but at a low temperature such as (c), the first overlapping portion and the second overlapping portion may overlap each other to a maximum.

Because the display device 1000 is large, the first decor 510 may also be composed of multiple pieces arranged to overlap each other. Alternatively, the first decor 510 may be slidably fastened to the cover fastening portion to accommodate the thermal expansion of the front cover 400.

As described above, according to one embodiment of the present disclosure, the front cover 400 maintains the flat surface even during the thermal deformation, so that no distortion of the screen occurs.

In addition, when the front cover 400 undergoes the thermal deformation, the frame and the fastening portion are not separated from each other or damaged, which may prevent an increase in a maintenance cost.

The above detailed description needs not be construed to be restrictive in any aspect and needs to be considered illustrative. The scope of the present disclosure needs to be determined by reasonable interpretation of the appended claims, and all changes within the equivalent scope of the present disclosure are included in the scope of the present disclosure.

What is claimed is:

1. A display device comprising:
a plurality of display modules;
a frame fixing the plurality of display modules on rear surfaces of the plurality of display modules; and
a front cover located on front surfaces of the plurality of display modules,
wherein the front cover includes:
a base plate;
a film layer located on at least one of a front surface and a rear surface of the base plate and including a surface-treatment layer; and
an optically clear adhesive (OCA) layer attaching the film layer to the base plate and subjected to a low-brightness treatment for having a low-brightness color.

2. The display device of claim 1, wherein the OCA layer contains the low-brightness color with a transmittance equal to or higher than 20% and equal to or lower than 60% compared to a transparent film.

3. The display device of claim 1,
wherein the surface-treatment layer includes a layer that has been subjected to a surface treatment of at least one of anti-fog treatment and anti-glare treatment.

4. The display device of claim 1, wherein the front cover contains at least one of glass, polycarbonate (PC), and polymethyl methacrylate (PMMA).

5. A display device comprising:
display modules;
a frame fixing the display modules on rear surfaces of the display modules;
a frame fastening portion formed on the frame;

a front cover located on front surfaces of the display modules; and
a cover fastening portion formed on the front cover,
wherein the cover fastening portion includes:
a first bracket including a sliding slot extending in a first direction; and
a second bracket coupled to the first bracket to be movable in a first direction and including a connector extending through the sliding slot,
wherein one of the first bracket and the second bracket is fixed to the front cover, and the other of the first bracket and the second bracket is fixed to the frame fastening portion, and
wherein, when the first bracket moves in the first direction with respect to the second bracket, a location in the first direction of the connector in the sliding slot changes.

6. The display device of claim 5, wherein the connector includes:
a body extending in a second direction and extending through the sliding slot; and
a head located on one side of the body and having a diameter greater than a width of the sliding slot,
wherein the second bracket includes a boss accommodating at least a portion of the body.

7. The display device of claim 6, wherein a length of the body is greater than a thickness of the first bracket with the sliding slot defined therein, and
wherein, when the first bracket moves in the second direction with respect to the second bracket, a location in the second direction of the connector in the sliding slot changes.

8. The display device of claim 5, wherein the cover fastening portion further includes a metal fastening portion located on an outer peripheral portion of the front cover, and
wherein the frame fastening portion includes a fastening magnet magnetically coupled to the metal fastening portion.

9. The display device of claim 5, wherein the frame fastening portion and the cover fastening portion respectively include a plurality of frame fastening portions and a plurality of cover fastening portions arranged along a perimeter of a collection of the display modules, and
wherein a cover fastening portion of the plurality of cover fastening portions located at a center of one side of the collection of the display modules is immovably fixed to the frame fastening portion.

10. The display device of claim 5, further comprising a deco frame covering an outer peripheral portion of the frame,
wherein the deco frame includes:
a first decor located on each side of the display device; and
a second decor at least partially overlapping the first decor and located at each corner of the display device.

11. The display device of claim 10, wherein the first decor and the second decor are coupled to the cover fastening portion.

12. The display device of claim 10, wherein the first decor forms a step at an end thereof and includes a thin first overlapping portion, and
wherein the second decor further includes a second overlapping portion at least partially overlapping the first overlapping portion at an end thereof, and a sum of thicknesses of the first overlapping portion and the second overlapping portion is equal to a thickness of the first decor and the second decor.

13. The display device of claim 5, wherein the front cover includes:

a base plate;

a film layer attached to at least one of a front surface and a rear surface of the base plate; and an optically clear adhesive (OCA) layer attaching the film layer to the base plate, wherein at least one of the base plate, the film layer, and the OCA layer is subjected to a low-brightness treatment.

14. A display device comprising:

a plurality of display modules;

a frame fixing the plurality of display modules on rear surfaces of the plurality of display modules;

a frame fastening portion formed on the frame; and a deco frame covering an outer peripheral portion of the frame, wherein the deco frame includes:

a first decor located on each side of the display device; and a second decor at least partially overlapping the first decor and located at each corner of the display device.

15. The display device of claim 14, wherein the first decor and the second decor are coupled to a cover fastening portion.

16. The display device of claim 14, wherein the first decor forms a step at an end thereof and includes a thin first overlapping portion, and wherein the second decor further includes a second overlapping portion at least partially overlapping the first overlapping portion at an end thereof, and a sum of thicknesses of the first overlapping portion and the second overlapping portion is equal to a thickness of the first decor and the second decor.

* * * * *